(12) United States Patent
Nakagawa

(10) Patent No.: US 10,056,547 B2
(45) Date of Patent: Aug. 21, 2018

(54) MANUFACTURING METHOD OF DISPLAY DEVICE, AND DISPLAY DEVICE

(71) Applicant: Japan Display Inc., Tokyo (JP)

(72) Inventor: Takuya Nakagawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/341,322

(22) Filed: Nov. 2, 2016

(65) Prior Publication Data

US 2017/0250342 A1    Aug. 31, 2017

(30) Foreign Application Priority Data

Feb. 26, 2016  (JP) ................................ 2016-035565

(51) Int. Cl.
*H05K 7/02* (2006.01)
*H05K 7/04* (2006.01)
(Continued)

(52) U.S. Cl.
CPC ............ *H01L 51/003* (2013.01); *H01L 24/32* (2013.01); *H01L 24/83* (2013.01); *H01L 27/3244* (2013.01); *H01L 51/0097* (2013.01); *H01L 51/56* (2013.01); *H05K 1/0306* (2013.01); *H05K 1/147* (2013.01); *H05K 1/189* (2013.01); *H05K 3/0029* (2013.01); *H05K 3/361* (2013.01); *H05K 7/02* (2013.01); *G09G 3/3225* (2013.01); *H01L 2224/32225* (2013.01); *H01L 2227/326* (2013.01); *H01L 2251/566* (2013.01); *H01L 2924/12044* (2013.01); *H01L 2924/1426* (2013.01); *H01L 2924/1515* (2013.01); *H05K 2201/042* (2013.01); *H05K 2201/10128* (2013.01)

(58) Field of Classification Search
CPC ...... H05K 1/0306; H05K 1/147; H05K 1/189; H05K 3/0029; H05K 3/361; H05K 7/02; H01L 51/003; H01L 24/32; H01L 24/83; H01L 27/3244; H01L 51/0097; H01L 51/56
USPC ......................................... 361/807, 809, 810
See application file for complete search history.

(56) References Cited

U.S. PATENT DOCUMENTS 9,379,355 B1 * 6/2016 Lee ..................... H01L 51/5253
9,614,168 B2 * 4/2017 Zhang ................. H01L 23/4985
(Continued)

FOREIGN PATENT DOCUMENTS

WO     2012/147322 A1    11/2012

OTHER PUBLICATIONS

Japanese Office Action dated May 8, 2018 for corresponding Japanese patent application 2016-035565 with partial translation.

*Primary Examiner* — Hung S Bui
(74) *Attorney, Agent, or Firm* — Typha IP LLC

(57) ABSTRACT

A manufacturing method of a display device includes locating a base member on a support substrate; and removing a part of the support substrate by preventing a first surface portion having a predetermined region in a border plane between the support substrate and the base member from being irradiated with laser light through the support substrate, whereas irradiating a second surface portion, other than the predetermined region, in the border plane between the support substrate and the base member with the laser light through the support substrate.

10 Claims, 11 Drawing Sheets

(51) Int. Cl.
  *H01L 51/00* (2006.01)
  *H01L 23/00* (2006.01)
  *H01L 27/32* (2006.01)
  *H01L 51/56* (2006.01)
  *H05K 1/03* (2006.01)
  *H05K 1/14* (2006.01)
  *H05K 1/18* (2006.01)
  *H05K 3/00* (2006.01)
  *H05K 3/36* (2006.01)
  *G09G 3/3225* (2016.01)

(56) References Cited

U.S. PATENT DOCUMENTS

| | | | |
|---|---|---|---|
| 2003/0161088 A1* | 8/2003 | Migita | H01L 21/6831 361/234 |
| 2011/0050657 A1* | 3/2011 | Yamada | H01L 27/3293 345/204 |
| 2011/0134018 A1 | 6/2011 | Seo et al. | |
| 2014/0049742 A1 | 2/2014 | Misono | |
| 2014/0092338 A1* | 4/2014 | Miyazaki | G02F 1/13452 349/58 |
| 2014/0126228 A1* | 5/2014 | Lee | H05K 5/0017 362/382 |
| 2014/0217382 A1 | 8/2014 | Kwon et al. | |
| 2014/0306941 A1* | 10/2014 | Kim | H04M 1/0268 345/204 |
| 2014/0327148 A1* | 11/2014 | Lim | H01L 23/00 257/774 |
| 2015/0212548 A1* | 7/2015 | Namkung | G06F 1/1652 345/174 |

* cited by examiner

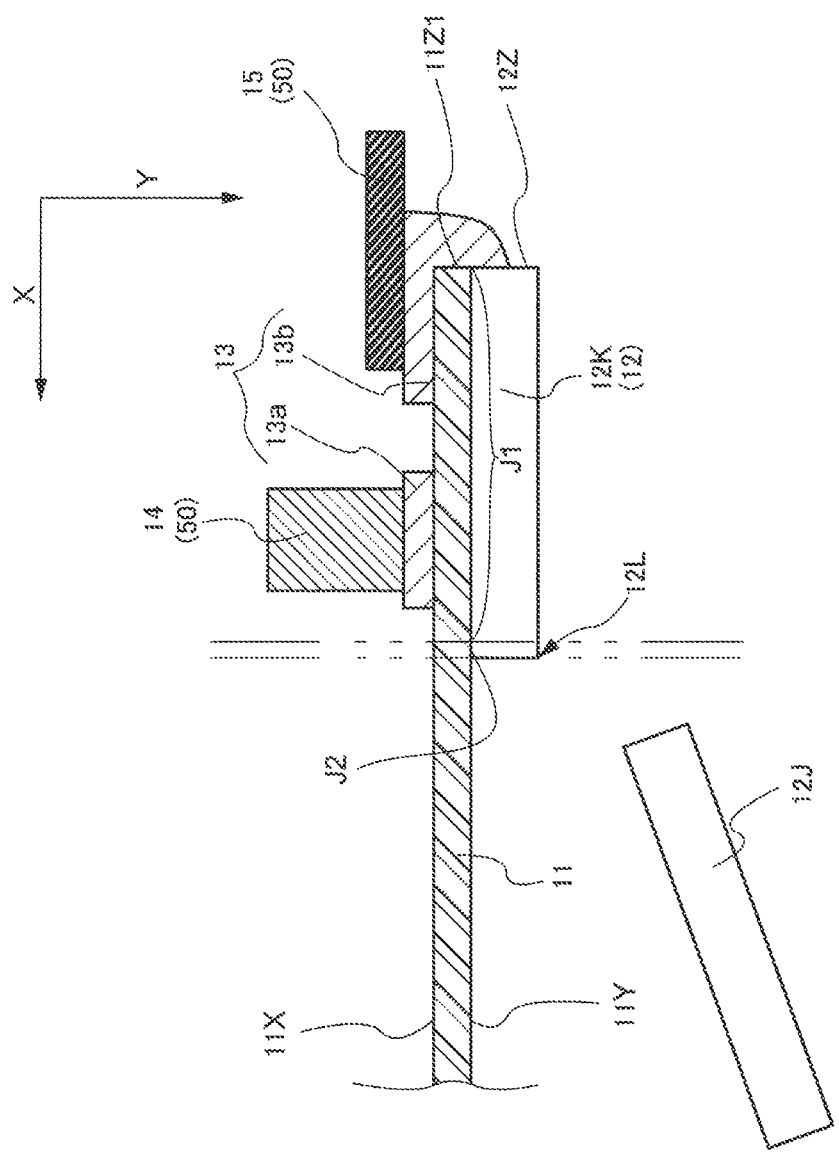

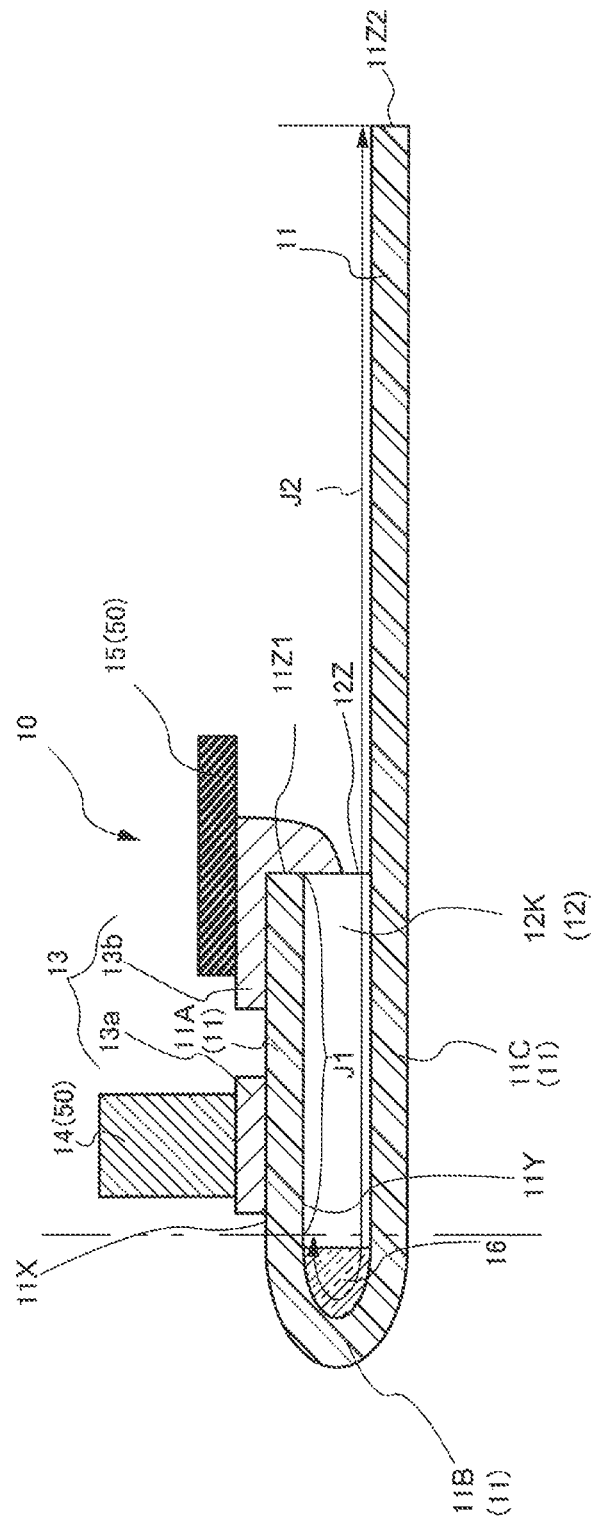

MANUFACTURING METHOD OF DISPLAY DEVICE, AND DISPLAY DEVICE

CROSS REFERENCE TO RELATED APPLICATIONS

This application is based upon and claims the benefit of priority from the prior Japanese Patent Application No. 2016-035565, filed on Feb. 26, 2016, the entire contents of which are incorporated herein by reference.

FIELD

The present invention relates to a manufacturing method of a display device including an electronic element, and to a display device.

BACKGROUND

United States Patent Application Publication No. 2011/0134018 discloses a technology for stacking a display panel on a support substrate and then removing the support substrate. In detail, the technology is as follows. A first plastic film layer and a first barrier layer are stacked on a first support substrate, and a thin film transistor is formed thereon. Then, a display device is formed thereon. On the display device, an encapsulation member (a member including a second support substrate, and a second plastic film layer and a second barrier layer stacked on the second support substrate) is located such that the second support substrate is on the outer side. These components are integrated, and then the first support substrate and the second support substrate are removed by laser light. In this example, the components between the first support substrate and the encapsulation member correspond to the display panel.

In the case where an electronic element is secured to the display panel (base member) stacked on the support substrate with an adhesive, the adhesive may possibly bond the electronic element, the display panel and the support substrate, instead of the electronic element and the display panel. In this case, the support substrate is not easily removed from the display panel or the electronic element even if being irradiated with laser light or the like. In addition, when the support substrate is removed from the display panel or the electronic element, the display panel or the electronic element may be possibly destroyed.

An end surface of the support substrate is scribed, and the scribed portion is roughened. Therefore, the laser light does not easily reach the adhesive at high precision. For this reason, the support substrate is not easily removed from the display panel even if being irradiated with laser light or the like. In addition, when the support substrate is removed from the display panel, the display panel may be destroyed. Even if it is attempted to remove the support substrate mechanically, a stress is applied to the display panel, which may possibly destroy the display panel.

SUMMARY

A manufacturing method of a display device in an embodiment according to the present invention includes locating a base member on a support substrate; and removing a part of the support substrate by preventing a first surface portion having a predetermined region in a border plane between the support substrate and the base member from being irradiated with laser light through the support substrate, whereas irradiating a second surface portion, other than the predetermined region, in the border plane between the support substrate and the base member with the laser light through the support substrate.

A display device in an embodiment according to the present invention includes a base member support portion formed of any of glass, a ceramic material and quartz; and a base member including a first flat portion covering a top surface the base member support portion, a U-shaped portion extending from the first flat portion, the U-shaped portion having a U-shaped cross-section, and a second flat portion extending from the U-shaped portion, the second flat portion covering a bottom surface of the base member support portion and being larger than the base member support portion.

A display device in an embodiment according to the present invention includes a base member support portion; and a base member including a first flat portion covering a top surface the base member support portion, a U-shaped portion extending from the first flat portion, the U-shaped portion having a U-shaped cross-section, and a second flat portion extending from the U-shaped portion, the second flat portion covering a bottom surface of the base member support portion and being larger than the base member support portion; wherein the first flat portion has a first surface facing the base member support portion, the U-shaped portion and the second flat portion has a second surface facing the base member support portion, and a roughness of the second surface is larger than a roughness of the first surface.

BRIEF DESCRIPTION OF DRAWINGS

FIG. 7 is a cross-sectional view showing a step of the manufacturing method of the display device;

FIG. 8B is a cross-sectional view showing a step of the manufacturing method of the display device, in which the base member is folded such that a second surface portion has a U-shaped cross-section to form a U-shaped portion.

DESCRIPTION OF EMBODIMENTS

Figure 1A:
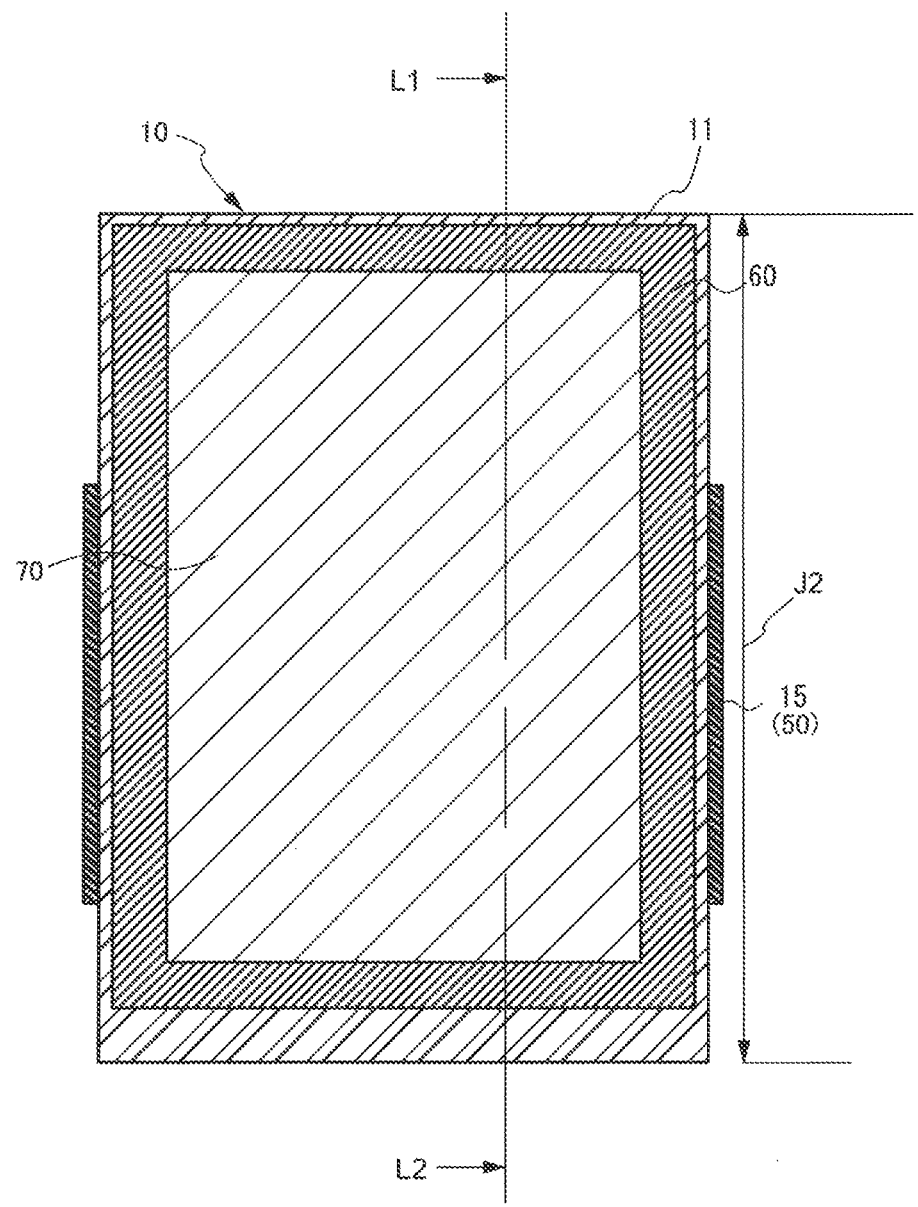
FIG. 1A is a plan view of a display device in an embodiment according to the present invention.

The present invention has an object of providing a manufacturing method of a display device that alleviates a phenomenon that when a support substrate is removed from a base member, the base member is destroyed from a portion thereof bonded with the support substrate.

Hereinafter, embodiments of the present invention will be described with reference to the drawings and the like. The present invention may be carried out in many different embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the interpretations of the present invention in any way. In the specification and the drawings, components that are substantially the same as those described or shown previously bear the identical reference signs thereto, and detailed descriptions thereof may be omitted.

In this specification, an expression that a component or area is "on" the other component or area encompasses a case where such a component or area is in contact with the other component or area and also a case where such a component or area is above or below the other component or area, namely, a case where still another component or area is provided between such a component or area and the other component or area, unless otherwise specified.

In the drawings, some reference signs each accompany another reference sign in parentheses. The reference sign in parentheses is provided for a term comprehensively used for a certain component and another certain component. For example, an integrated circuit 14 and a circuit board 15 are comprehensively referred to as electronic elements 50, and reference sign 50 is put in parentheses.

Figure 1B:
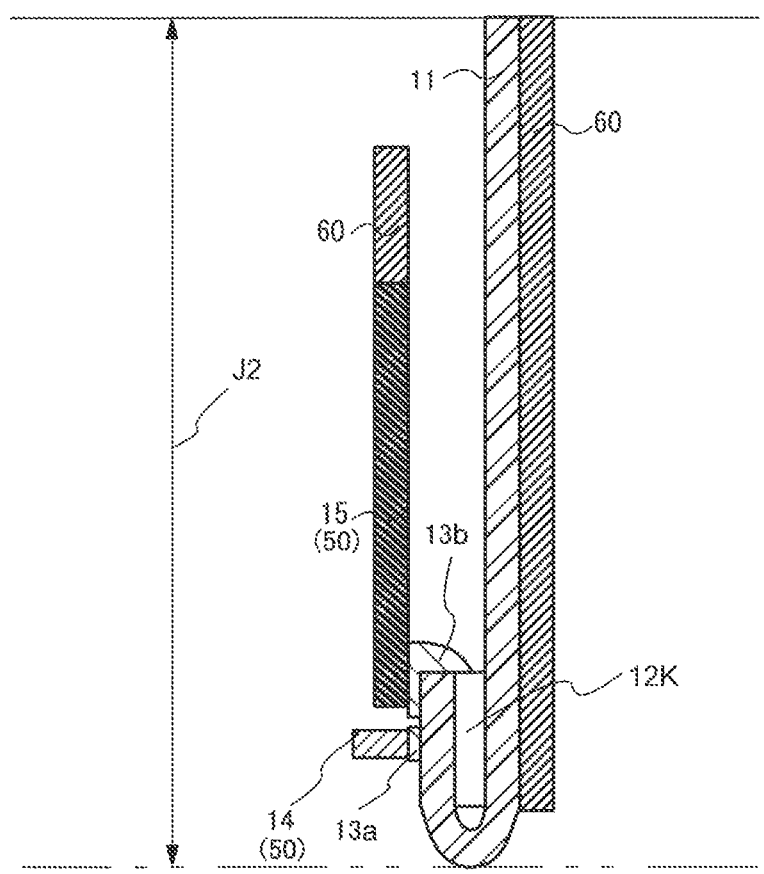
FIG. 1B is a cross-sectional view taken along line L1-L2 in FIG. 1A.
Figure 2A:
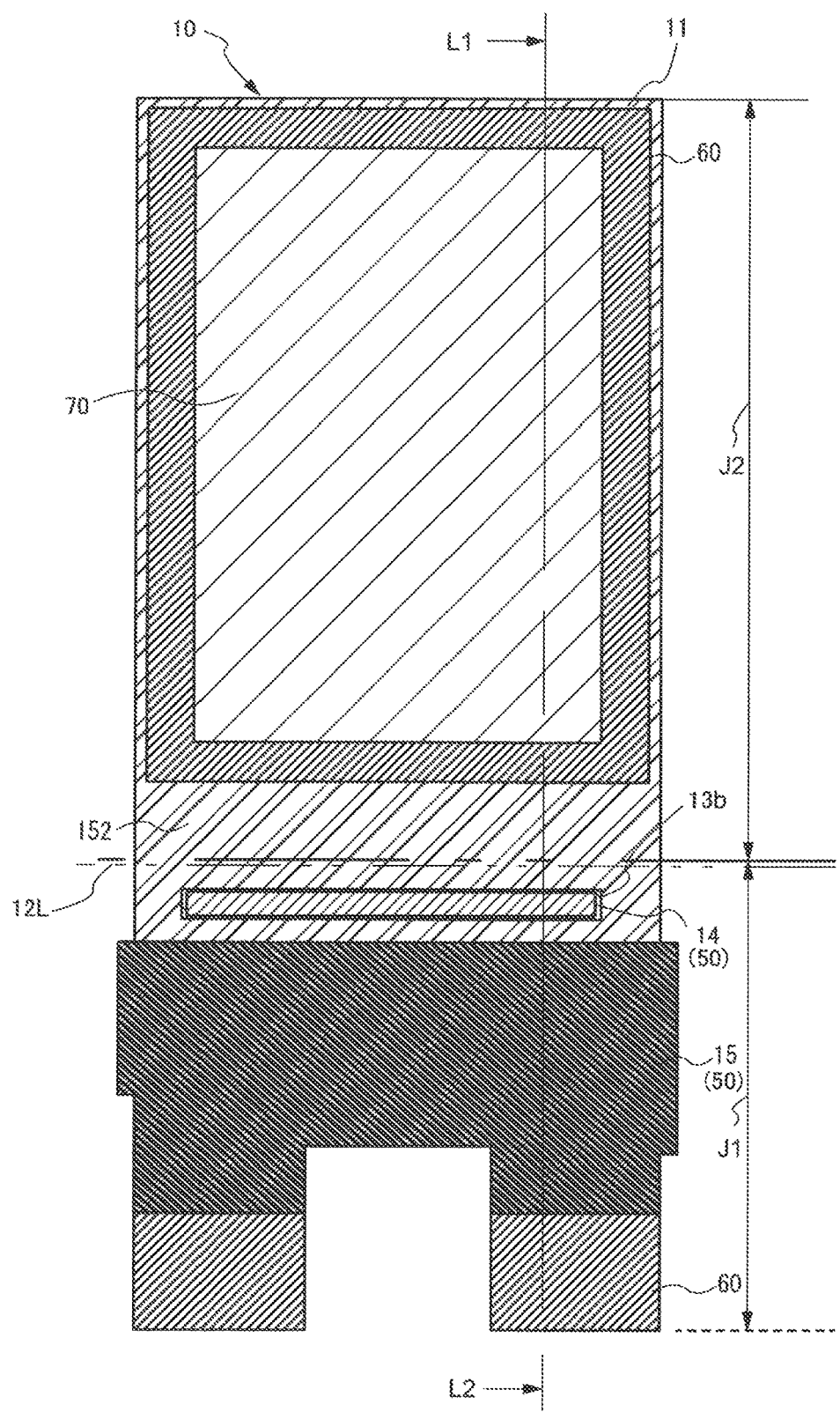
FIG. 2A is a developed plan view showing the display device in a non-folded state.
Figure 2B:
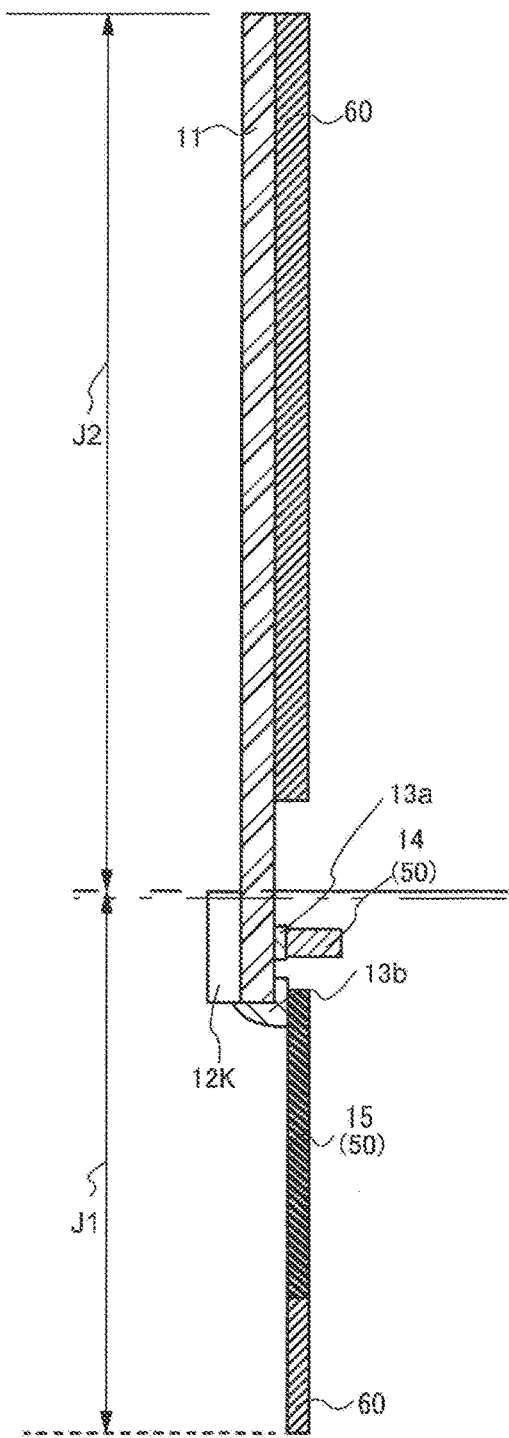
FIG. 2B is a developed cross-sectional view showing the display device 10 in a non-folded state.

FIG. 1A is a plan view of a display device 10 in an embodiment according to the present invention, and FIG. 1B is a cross-sectional view taken along line L1-L2 in FIG. 1A. FIG. 2A is a developed plan view showing the display device 10 in a non-folded state, and FIG. 2B is a developed cross-sectional view showing the display device 10 in a non-folded state. The display device 10 includes a base member 11, a display region 70 provided on a surface of the base member 11, and a film layer 60 provided on the surface of the base member 11.

The display device 10 also includes a circuit board 15 connected with the base member 11. The circuit board 15 may be, for example, a flexible printed circuit (FPC) or the like. An integrated circuit 14 is provided between the circuit board 15 and the display region 70. The integrated circuit 14 may be, for example, an IC (integrated circuit) chip or the like.

The display region 70 includes a plurality of pixels (not shown) usable to reproduce an image. The pixels each include a display element and one or a plurality of transistors electrically connected with the display element. The display elements are each controlled by the transistor(s). The pixels are each electrically connected with the integrated circuit 14, and are each driven in accordance with a video signal input from outside via the circuit board 15.

The display element may be, for example, an organic EL light emitting element. The plurality of pixels included in the display region 70 may include light emitting elements providing different colors of light from each other. Alternatively, the plurality of pixels included in the display region 70 may include light emitting elements all providing white light. In this case, a desired color of light is provided by the light emitting element and a color filter.

The integrated circuit 14 may be formed by use of, for example, a semiconductor substrate, and is secured to the base member 11 or the circuit board 15. The integrated circuit 14 acts as a driving circuit controlling the pixels. The display region 70 may be provided with another driving circuit. Alternatively, the display region 70 may not be provided with the integrated circuit 14, and the driving circuit may be provided in the vicinity of the display region 70.

The display device 10 may be distributed in the folded state as shown in FIG. 1A and FIG. 1B or in the non-folded state as shown in FIG. 2A and FIG. 2B. For example, it may be conceivable that manufacturers of components sell the display device 10 in the non-folded state as shown in FIG. 2A and FIG. 2B to manufactures of finished products. Alternatively, it may be conceivable that manufactures of finished products sell the display device 10 in the folded state as shown in FIG. 1A and FIG. 1B.

Figure 3:
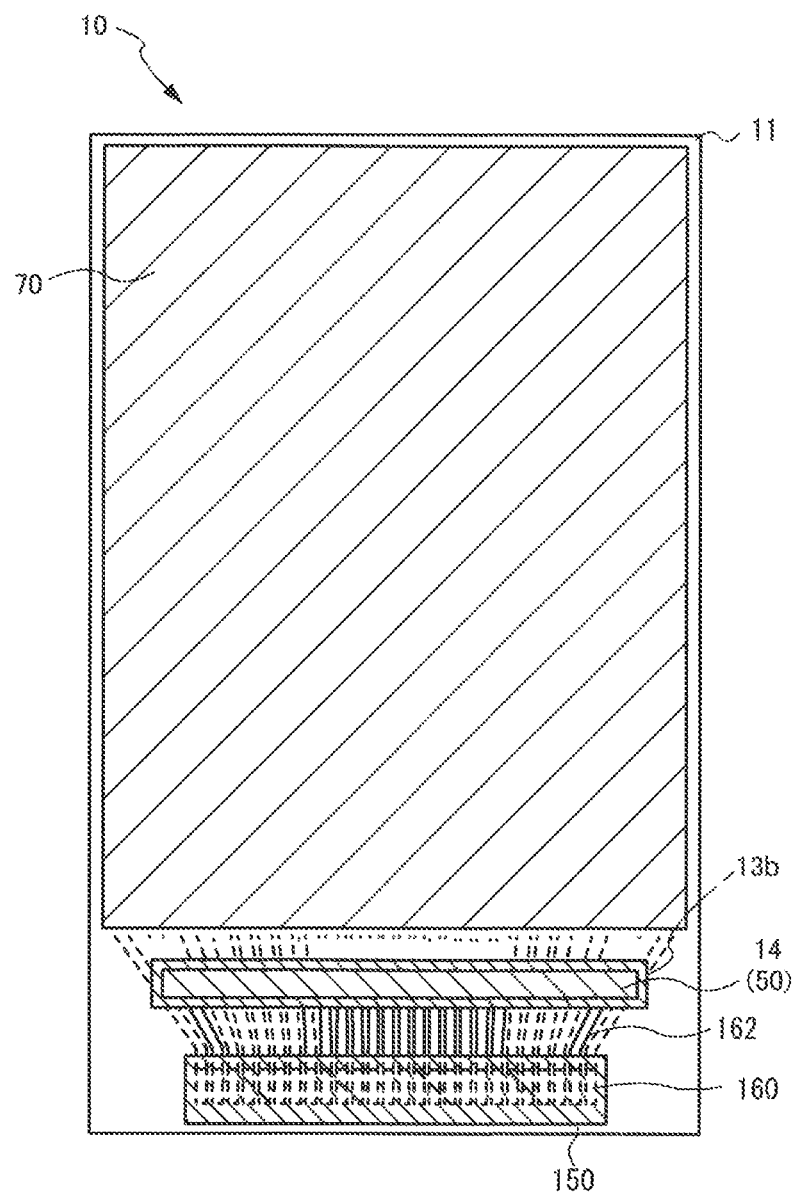
FIG. 3 shows a structure of the display device in the state where a circuit board is excluded.

FIG. 3 shows a structure of the display device 10 in the state where the circuit board 15 shown in FIG. 2A is excluded. Lines 162 are located to extend from the display region 70 to side surfaces of terminals 160. The lines 162 are electrically connected with the display region 70 and the integrated circuit 14. Each of the lines 162 is partially exposed, and the exposed part acts as a terminal 160. The terminals 160 are connected with the circuit board 15 by a conductive film 150 such as an anisotropic conductive film or the like.

Figure 4:
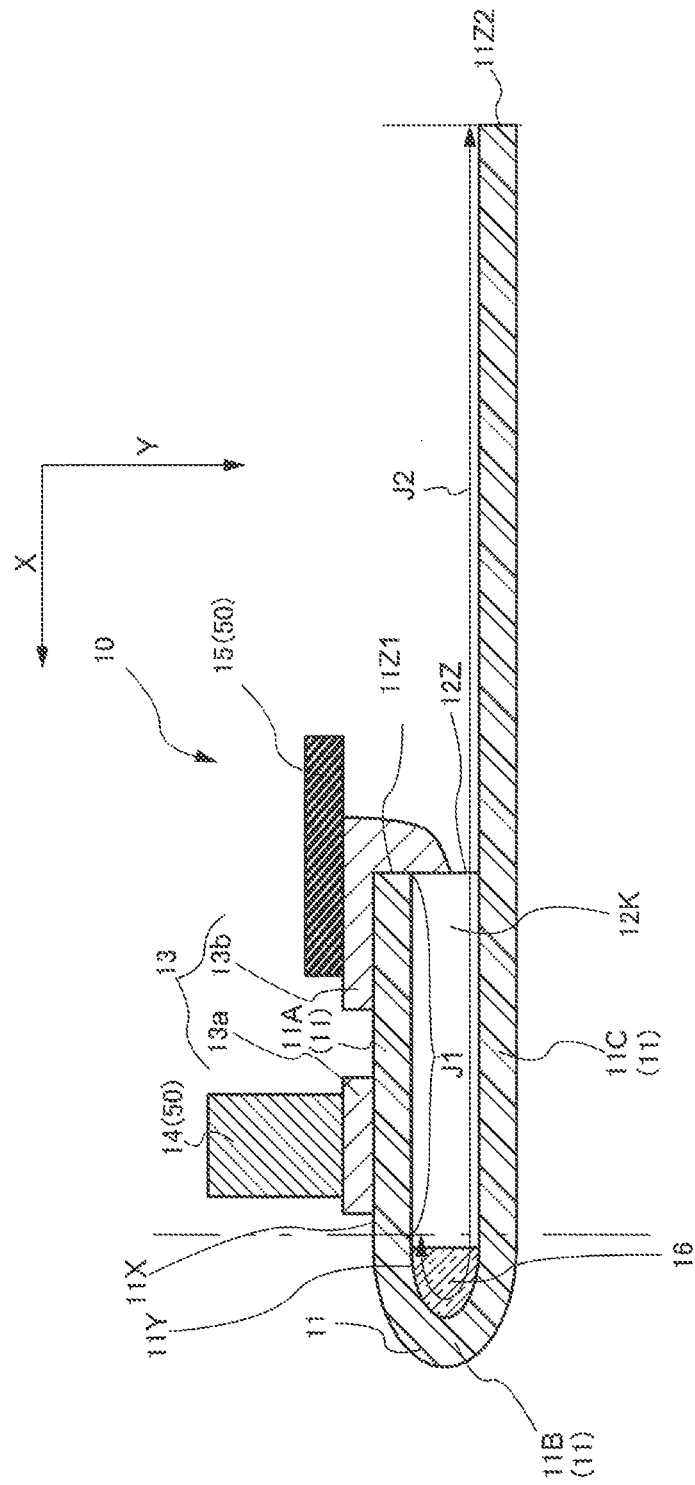
FIG. 4 is a partial cross-sectional view of the display device taken along line L1-L2 shown in FIG. 1A in the state where a film layer is excluded.

FIG. 4 is a partial cross-sectional view of the display device 10 taken along line L1-L2 shown in FIG. 1A in the state where the film layer 60 is excluded. As shown in FIG. 4, the display device 10 further includes a base member support portion 12K and the base member 11. Electronic members 50 are attached to the base member 11. In this example, the circuit board 15 and the integrated circuit 14 are used as the electronic elements 50. The display device 10 is not limited to including such electronic elements, and another electronic element may be used.

[Base Member]

The base member 11 includes a flat portion, a curved portion and a flat portion that are extending from one end 11Z1 to the other end 11Z2. Namely, the base member 11 includes a first flat portion 11A, a U-shaped portion 11B and a second flat portion 11C, which are located in this order continuously. The base member 11 is formed of, for example, polyimide. The base member 11 is not limited to being formed of polyimide, and may be formed of another material.

Figure 6:
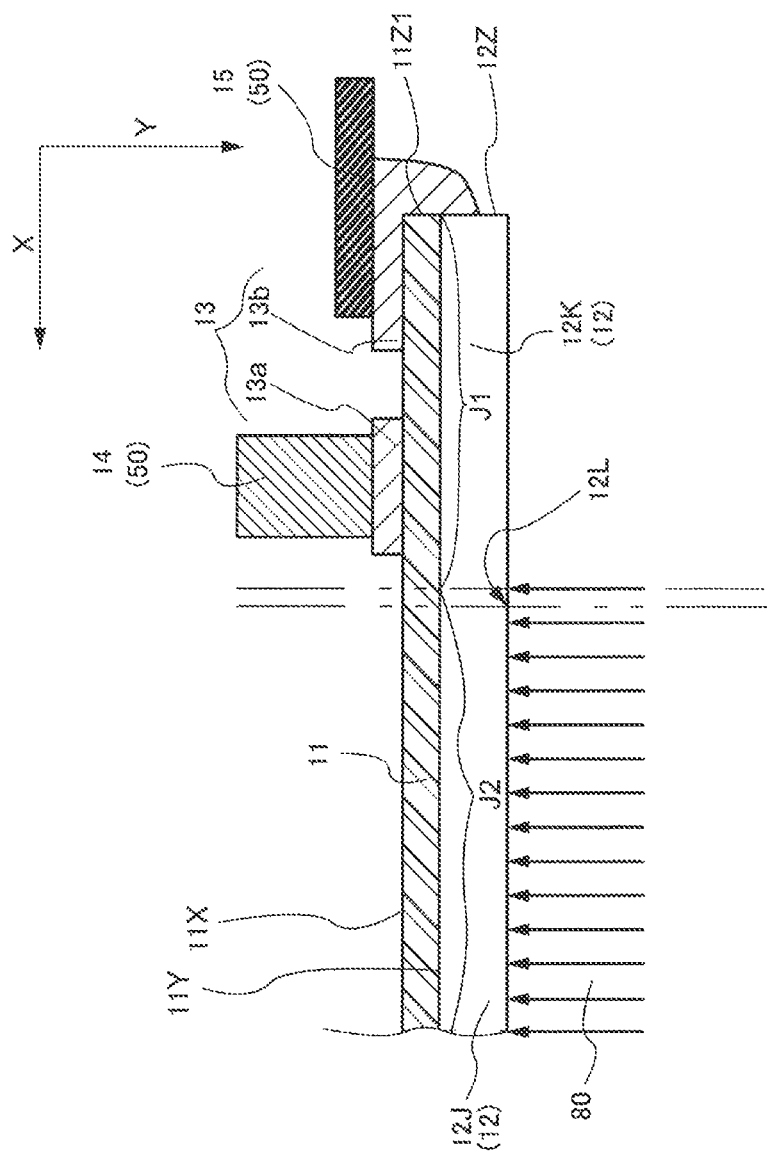
FIG. 6 is a cross-sectional view showing a step of a manufacturing method of the display device.

The first flat portion 11A has the integrated circuit 14 and the circuit board 15 (described above) attached to a top surface thereof, and covers a top surface of the base member support portion 12K located below the first flat portion 11A. A surface of the first flat portion 11A facing the base member support portion 12K is a first surface portion J1, which has not been irradiated with laser light 80 (FIG. 6).

The U-shaped portion 11B is extending from the first flat portion 11A, and is folded to have a U-shape cross-section. The U-shaped portion 11B covers an outer circumferential surface of a spacer 16 described below. The spacer 16 is located inner to the U-shape portion 11B. A surface of the U-shaped portion 11B facing the base member support portion 12K is a second surface portion J2, which has been irradiated with the laser light 80.

The second flat portion 11O is extending from the U-shaped portion 11B. The second flat portion 11C covers a bottom surface of the base member support portion 12K, and is longer than the base member support portion 12K in direction X along a surface of the base member 11 as seen in a cross-sectional view. The second flat portion 11C is configured to be larger than the base member support portion 12K in this example, but does not need to be larger than the base member support portion 12K. A surface of the second flat portion 11C facing the base member support portion 12K is also the second surface portion J2, which has been irradiated with the laser light 80.

The second flat portion 11O has the display elements provided thereon and is used as a part of the display panel. The first flat portion 11A and the second flat portion 11C of the base member 11 sandwich the base member support portion 12K from above and below.

[Support Substrate]

The base member support portion 12K is formed of, for example, glass. The base member support portion 12K needs to transmit the laser light 80 during the manufacturing of the display device 10 as described below. Therefore, the base member support portion 12K may be formed of any of at least glass, a ceramic material and quartz. Alternatively, the base member support portion 12K may be formed of any other material transmitting the laser light 80. This is also applicable to a material of a support substrate 12 including the base member support portion 12K described below.

The base member support portion 12K is generally quadrangular as seen in a cross-sectional view. The spacer 16 is located inner to the U-shaped portion 11B (area enclosed by the U-shaped portion 11B and the base member support portion 12K). Thus, the base member support portion 12K and the spacer 16 are located in an area that is to the left of the one end 11Z1 of the base member 11 and is enclosed by the first flat portion 11A, the U-shaped portion 11B and the second flat portion 11O. The "left" mentioned above is left in FIG. 4. The base member support portion 12K and the spacer 16 act together as a spacer; namely, the base member support portion 12K also acts as a spacer.

If the base member support portion 12K is not used, a spacer having a size equal to the combined area of the base member support portion 12K and the spacer 16 is needed for the manufacturing of the display device 10. In this embodiment, the base member support portion 12K is used as a spacer, and thus the size of the spacer 16 separately prepared may be reduced by the size of the base member support portion 12K.

As seen in a plan view (as seen in thickness direction Y of the base member 11), the base member support portion 12K is located to overlap the integrated circuit 14 and the circuit board 15. Namely, as seen from above the base member 11 shown in FIG. 4, the base member support portion 12K, and the electronic elements 20, for example, the integrated circuit 14 and the circuit board 15, overlap each other. In other words, the base member support portion 12K may be located below a portion of the base member 11 above which members that are not to be curved are provided. In this example, the electronic elements 50 are located above the base member 11, and the base member support portion 12K is located below the base member 11.

The base member support portion 12K faces the first plane J1 of the base member 11. As described below, during the manufacturing of the display device 10, the support substrate 12 includes the base member support portion 12K and a removal portion 12J (FIG. 6). The removal portion 12J is a portion of the support substrate 12 that is to be removed by the laser light 80 transmitting the removal portion 12J toward the base member 11. The base member support portion 12K is a portion of the support substrate 12 that is not irradiated with the laser light 80 and therefore is left. As shown in FIG. 4, the display device 10 as a finished product includes the base member support portion 12K, but not the removal portion 12J.

[Relationship Between the First Surface Portion and the Second Surface Portion of the Base Member]

The second surface portion J2 of the base member 11 has a carbon concentration higher than the carbon concentration of the first surface portion J1 of the base member 11. When the base member 11 is irradiated with the laser light 80, the second surface portion J2 of the base member 11 is carbonized. The first surface portion J1 of the base member 11, which is not irradiated with the laser light 80, is not carbonized. This is why the carbon concentration of the second surface portion J2 is higher than that of the first surface portion J1.

The second surface portion J2 of the base member 11 has a surface roughness higher than the surface roughness of the first surface portion J1 of the base member 11.

[Electronic Element]

The circuit board 15 is located closer, than the integrated circuit 14, to the one end 11Z1 of the base member 11 in direction X along the surface of the base member 11. The integrated circuit 14 and the circuit board 15 as the electronic elements 50 overlap the base member support portion 12K as seen in a plan view (as seen in thickness direction Y in FIG. 4).

The integrated circuit 14 is secured to the surface of the base member 11 by an adhesive layer 13a. The circuit board 15 is secured to the surface of the base member 11 by an adhesive layer 13b.

In this example, the adhesive layer 13b, which is a single layer, bonds the circuit board 15, the base member 11 and the base member support portion 12K together. Namely, as shown in FIG. 4, the single adhesive layer 13b bonds a bottom surface of the circuit board 15 (surface facing the first flat portion 11A described below), the one end 11Z1 of the first flat portion 11A of the base member 11, and one end 12Z of the base member support portion 12K. Therefore, the base member support portion 12K is secured to both of the base member 11 and the circuit board 15.

In other words, the single adhesive layer 13b bonds the base member support portion 12K and the base member 11, bonds the base member 11 and the circuit board 15, and bonds the circuit board 15 and the base member support portion 12K. The significance of the base member support portion 12K is provided by the base member support portion 12K and the base member 11 being bonded together. Therefore, it may be sufficient that the adhesive layer 13b bonds at least the base member support portion 12K and the base member 11.

Figure 5:
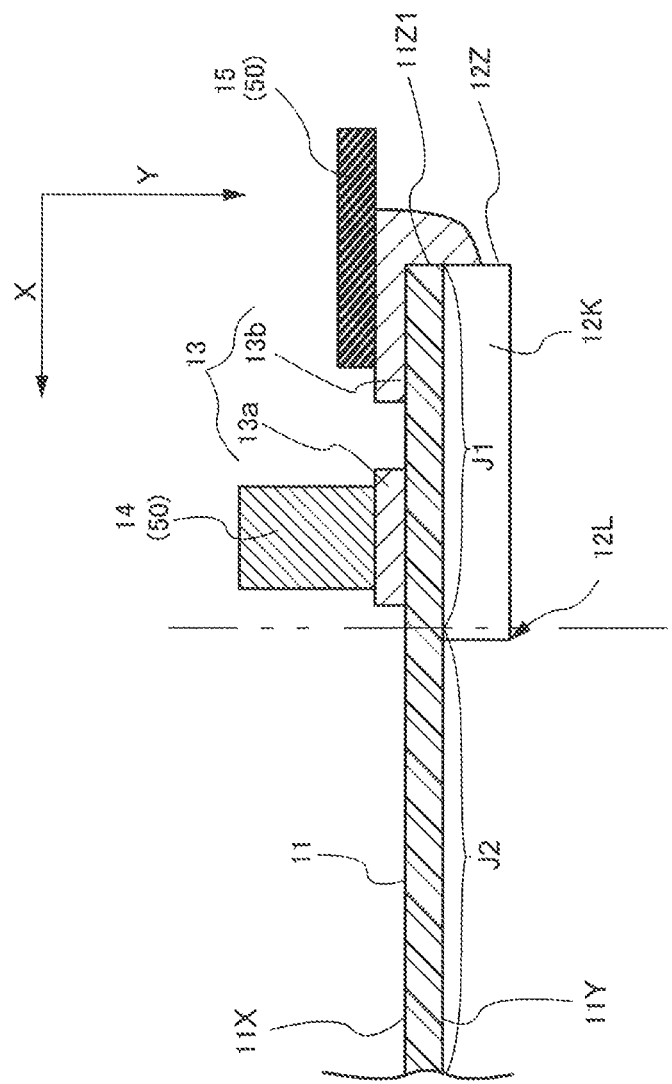
FIG. 5 is a partial cross-sectional view of the display device taken along line L1-L2 shown in FIG. 2A in the state where the film layer is excluded.

FIG. 5 is a partial cross-sectional view of the display device 10 taken along line L1-L2 shown in FIG. 2A in the state where the film layer 60 is excluded. FIG. 5 corresponds to a state before the display device shown in FIG. 4 is folded.

The base member 11 covers, and extends beyond, the top surface of the base member support portion 12K in direction X along the surface of the base member 11. The base member 11 includes the first surface portion J1 and the second surface portion J2. The first surface portion J1 faces the base member support portion 12K and includes a portion that has not been irradiated with the laser light 80 directed from the side of the support substrate 12. The second surface portion J2 is extending from the first surface portion J1, and has been irradiated with the laser light 80 directed from the side of the support substrate 12.

The base member support portion 12K faces the base member 11 in thickness direction Y of the base member 11 in a portion that is closer, than the center of the base member 11, to the one end 11Z1 in direction X along the surface of the base member 11. A reason for this is that a position at which the adhesive layer 13b bonds the electronic elements 50, the base member 11 and the base element support substrate 12K is closer, than the center of the base member 11, to the one end 11Z1 in direction X along the surface of the base member 11.

It is conceivable the one end 12Z of the base member support portion 12K, the one end 11Z1 of the base member 11, and the bottom surface of the circuit board 15 are bonded together by the adhesive 13b. In the case where a scribed area of the base member support portion 12K is roughened on the side of the one end 11Z1 of the base member 11, the surfaces of the base member support portion 12K and the base member 11 facing each other may be bonded together strongly on the side of the one end 11Z1 of the base member 11. It is also conceivable that a surface of the one end 12Z of the base member support portion 12K side and a surface of the one end 11Z1 of the base member 11 side that face each other and strongly bonded together by the adhesive 13b (even if the circuit board 15 is not bonded, the base member support portion 12K may not be peeled off easily).

FIG. 6, FIG. 7, FIG. 8A and FIG. 8B are cross-sectional views each showing a step of a manufacturing method of the display device 10. Hereinafter, with reference to FIG. 6, FIG. 7, FIG. 8A and FIG. 8B, the manufacturing method of the display device 10 will be described.

As shown in FIG. 6, the base member 11 is placed on the support substrate 12, and the integrated circuit 14 and the circuit board 15 are mounted on the base member 11. As a result, the integrated circuit 14 and the circuit board 15 as the electronic elements 50 are located on the top surface of the base member 11 (represented by 11X), and the support substrate 12 is located on the bottom surface of the base member 11 (represented by 11Y).

The base member 11 and the support substrate 12 may be, or may not be, bonded together. In the case where being bonded together, the base member 11 and the support substrate 12 may be bonded by an adhesive (not shown) or a both-sided adhesive tape. On the side of the one end 11Z1 of the base member 11, the circuit board 15, the base member 11 and the support substrate 12 are bonded together by the adhesive layer 13b.

A scribe line 12L is formed in a surface of the support substrate 12 at a position away from a border between a portion of the surface of the base member 11 that is to be the second surface portion J2 and a portion of the base member 11 that is to be the first surface portion J1. The position is away from the border by a predetermined distance in direction X along the surface of the base member 11. Namely, the scribe line 12L is formed at a position corresponding to a position of the bottom surface 11Y of the base member 11 at which the surface of the base member 11 is to be divided into two. The scribe line 12L (dividing schedule line) is a linear scratch (thick two-dot chain line in FIG. 2).

A predetermined region of the bottom surface 11Y of the base member 11, in other words, a predetermined portion of the interface between the support substrate 12 and the base member 11, is prevented from being irradiated with the laser light 80 directed from the side of the support substrate 12. The portion other than the predetermined portion of the interface between the support substrate 12 and the base member 11 is irradiated with the laser light 80 directed from the side of the support substrate 12. The irradiated portion is defined as the second surface portion J2, and the non-irradiated portion is defined as the first surface portion J1.

As shown in FIG. 7, a portion of the support substrate 12 that is to the left of the scribe line 12L is removed as the removal portion 12J. The "left" mentioned above is left in FIG. 7. At the same time, the remaining portion of the support substrate 12, which has not been irradiated with the laser light 80, is left as the base member support portion 12K. As a result, the surface of the base member support portion 12K facing the base member 11 includes a portion facing the first surface portion J1, which has not been irradiated with the laser light 80, and also a portion facing a part of the second surface portion J2 that has been irradiated with the laser light 80.

In the above-described example, the scribe line 12L is formed before the support substrate 12 and the like are irradiated with the laser light 80. The manufacturing method of the display device 10 is not limited to this. The scribe line 12L may be formed to remove the removal portion 12J after the laser light 80 is directed to a border plane between the support substrate 12 and the base member 11 through the support substrate 12.

Figure 8A:
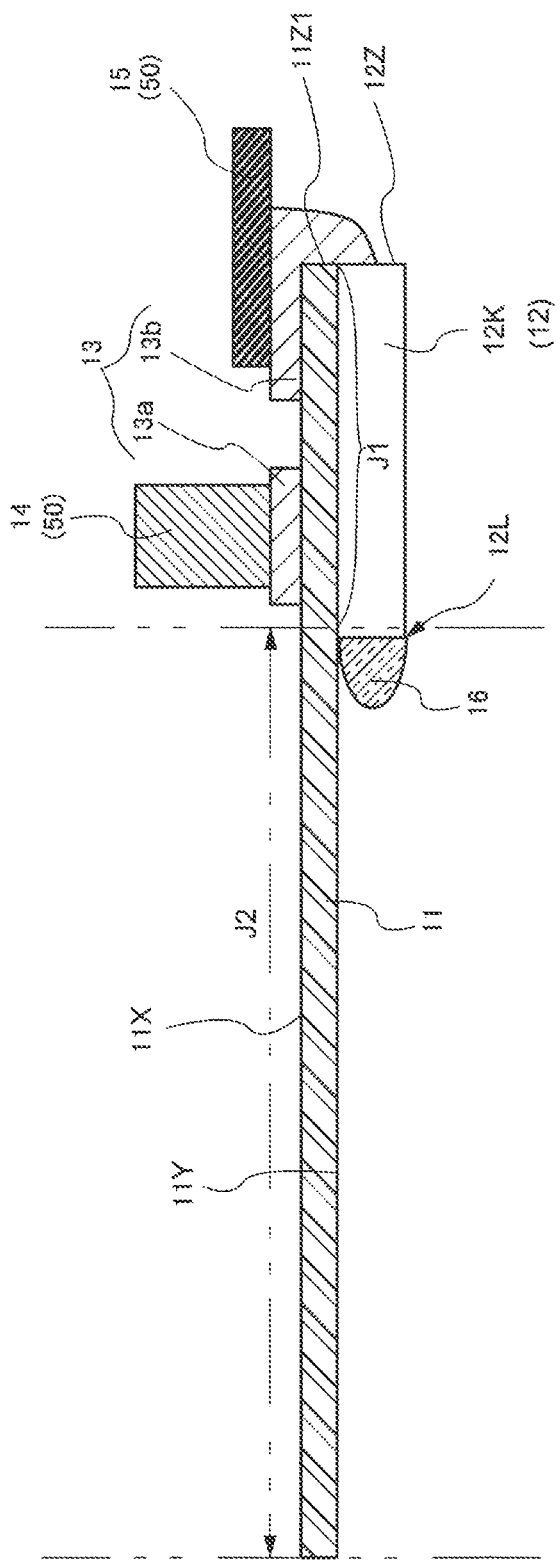
FIG. 8A is a cross-sectional view showing a step of the manufacturing method of the display device, in which a spacer is located on a border plane between a removed portion and a base member support portion of a support substrate.

Next, as shown in FIG. 8A, the spacer 16 is located on a border plane between the removal portion 12J, which has already been removed, and the base member support portion 12K.

Then, as shown in FIG. 8B, the base member 11 is folded such that the second surface portion J2 has a U-shaped cross-section to form the U-shaped portion 11B. The second surface portion J2 is further folded to contact the base member support portion 12K to sandwich the base member support portion 12K together with the first surface portion 11A. A portion of the base member 11 that is not in contact with the base member support portion 12K is left extended without being folded.

With the above-described embodiment, when the support substrate 12 is removed from the base member 11, the phenomenon that the base member 11 is destroyed from the portion thereof that is bonded with the support substrate 12 is alleviated. The support substrate 12, which is used to support the display device 10, is also usable as a spacer when the display device 10 is folded.

What is claimed is:
1. A display device, comprising:
a base member support portion formed of any one of glass, a ceramic material and quartz;
a base member including a first flat portion covering a top surface of the base member support portion, a U-shaped portion extending from the first flat portion, the U-shaped portion having a U-shaped cross-section, and a second flat portion extending from the U-shaped portion, the second flat portion covering a bottom surface of the base member support portion and being larger than the base member support portion; and
an electronic element located on the base member, the electronic element overlapping the base member support portion as seen in a plan view, wherein
the base member support portion has a first side surface and a second side surface which intersect the top surface and the bottom surface, the first side surface facing the U-shaped portion, and the second side surface being opposite to the first side surface, and
the electronic element, the base member, and the second side surface are continuously bonded by an adhesive; and
a spacer located on an inner side to the U-shaped portion.
2. The display device according to claim 1, wherein the base member support portion is quadrangular as seen in a cross-sectional view.

3. The display device according to claim 1, wherein the base member support portion faces the base member in a portion closer to an end of the base member than to a center of the base member.

4. The display device according to claim 1, wherein a surface, of the U-shaped portion and the second flat portion, facing the base member support portion has a carbon concentration higher than that of a surface, of the first flat portion, facing the base member support portion.

5. The display device according to claim 1, wherein a surface, of the U-shaped portion and the second flat portion, facing the base member support portion has a surface roughness higher than that of a surface, of the first flat portion, facing the base member support portion.

6. A display device, comprising:
a base member support portion;
a base member including a first flat portion covering a top surface of the base member support portion, a U-shaped portion extending from the first flat portion, the U-shaped portion having a U-shaped cross-section, and a second flat portion extending from the U-shaped portion, the second flat portion covering a bottom surface of the base member support portion and being larger than the base member support portion; and
an electronic element located on the base member, the electronic element overlapping the base member support portion as seen in a plan view, wherein
the base member support portion has a first side surface and a second side surface which intersect the top surface and the bottom surface, the first side surface facing the U-shaped portion, and the second side surface being opposite to the first side surface,
the electronic element, the base member, and the second side surface are continuously bonded by an adhesive,
the first flat portion has a first surface facing the base member support portion,
the U-shaped portion and the second flat portion have a second surface facing the base member support portion, and
a roughness of the second surface is larger than a roughness of the first surface.

7. The display device according to claim 6, wherein the base member support portion is quadrangular as seen in a cross-sectional view.

8. The display device according to claim 6, further comprising a spacer located on an inner side to the U-shaped portion.

9. The display device according to claim 6, wherein a portion where the base member support portion faces the base member is closer to an end of the base member than to a center of the base member.

10. The display device according to claim 6, wherein the second surface has a carbon concentration higher than that of the first surface.

* * * * *